United States Patent
Kim et al.

(10) Patent No.: US 10,943,626 B1
(45) Date of Patent: Mar. 9, 2021

(54) SEMICONDUCTOR MEMORY DEVICE WITH POWER GATING CIRCUIT FOR DATA INPUT-OUTPUT CONTROL BLOCK AND DATA INPUT/OUTPUT BLOCK AND SEMICONDUCTOR SYSTEM INCLUDING THE SAME

(71) Applicant: SK hynix Inc., Gyeonggi-do (KR)

(72) Inventors: Woongrae Kim, Gyeonggi-do (KR); Yoo-Jong Lee, Gyeonggi-do (KR); A-Ram Rim, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/232,205

(22) Filed: Dec. 26, 2018

Related U.S. Application Data (60) Provisional application No. 62/610,452, filed on Dec. 26, 2017.

(51) Int. Cl.
  *G11C 7/10* (2006.01)

(52) U.S. Cl.
  CPC ............ *G11C 7/1048* (2013.01); *G11C 7/106* (2013.01); *G11C 7/1069* (2013.01); *G11C 7/1096* (2013.01); *G11C 7/1057* (2013.01); *G11C 7/1084* (2013.01)

(58) Field of Classification Search
  None
  See application file for complete search history.

(56) References Cited

U.S. PATENT DOCUMENTS

| | | | | |
|---|---|---|---|---|
| 2004/0151050 A1* | 8/2004 | Ooishi | ................. | G11C 11/406 365/226 |
| 2005/0286339 A1* | 12/2005 | Parris | ..................... | G11C 5/144 365/236 |
| 2007/0201295 A1* | 8/2007 | Lines | ...................... | G11C 7/06 365/230.03 |
| 2009/0129192 A1* | 5/2009 | Barth, Jr. | ................ | G11C 5/147 365/226 |
| 2012/0033521 A1* | 2/2012 | Nakamura | ....... | H03K 19/17784 365/226 |
| 2012/0286850 A1* | 11/2012 | Myers | ................. | G11C 14/0054 327/530 |
| 2012/0287712 A1* | 11/2012 | Murakami | ........... | G11C 7/1084 365/185.05 |
| 2013/0120045 A1* | 5/2013 | Hegde | ................... | G06F 1/3287 327/185 |

(Continued)

FOREIGN PATENT DOCUMENTS

KR   101716965   3/2017

*Primary Examiner* — J. H. Hur
(74) *Attorney, Agent, or Firm* — IP & T Group LLP (57) ABSTRACT

A semiconductor device includes a data input/output control block including a first power gating circuit coupled to a supply terminal of a first voltage and a second power gating circuit coupled to a supply terminal of a second voltage, the data input/output control block suitable for generating a control signal using the first and second voltages, a data input/output block including a third power gating circuit coupled to any one of the supply terminal of the first voltage and the supply terminal of the second voltage, the data input/output block suitable for inputting and outputting a data signal using the first and second voltages based on the control signal, and a memory block, coupled to the data input/output block, suitable for writing or reading the data signal.

25 Claims, 6 Drawing Sheets

(56) References Cited

U.S. PATENT DOCUMENTS

| | | | | |
|---|---|---|---|---|
| 2013/0141988 A1* | 6/2013 | McCombs | ........... | G11C 7/1051 |
| | | | | 365/189.05 |
| 2013/0290753 A1* | 10/2013 | Ramaraju | ............. | G06F 1/3225 |
| | | | | 713/320 |
| 2017/0194041 A1* | 7/2017 | Kim | .................... | H01L 23/5286 |
| 2018/0366422 A1* | 12/2018 | Matsubara | ............ | H01L 23/645 |
| 2019/0304530 A1* | 10/2019 | Choi | ..................... | G11C 11/409 |

* cited by examiner

SEMICONDUCTOR MEMORY DEVICE WITH POWER GATING CIRCUIT FOR DATA INPUT-OUTPUT CONTROL BLOCK AND DATA INPUT/OUTPUT BLOCK AND SEMICONDUCTOR SYSTEM INCLUDING THE SAME

CROSS-REFERENCE TO RELATED APPLICATION

This application claims priority under 35 U.S.C. § 119(a) to U.S. Provisional Patent Application No. 62/610,452, filed on Dec. 26, 2017, the disclosure of which is incorporated herein by reference in its entirety.

BACKGROUND

1. Field

Various embodiments of the present invention relate to a semiconductor design technique, and more particularly, to a semiconductor device including a power gating circuit and a semiconductor system including the semiconductor device.

2. Description of the Related Art

Semiconductor devices should be designed to minimize unnecessary power consumption such as standby power. In particular, because many portable devices use batteries, which are of limited power supply, power consumption is an important design issue.

SUMMARY

Various embodiments of the present invention are directed to a semiconductor device having a power gating structure which is optimally designed depending on intended use.

Various embodiments of the present invention are directed to a semiconductor system including a semiconductor device that has a power gating structure which is optimally designed depending on intended use and performs a power gating operation regardless of control of a control device.

In accordance with an embodiment of the present invention, a semiconductor device includes: a data input/output control block including a first power gating circuit coupled to a supply terminal of a first voltage and a second power gating circuit coupled to a supply terminal of a second voltage, the data input/output control block suitable for generating a control signal using the first and second voltages; a data input/output block including a third power gating circuit coupled to any one of the supply terminal of the first voltage and the supply terminal of the second voltage, the data input/output block suitable for inputting and outputting a data signal using the first and second voltages based on the control signal; and a memory block, coupled to the data input/output block, suitable for writing or reading the data signal.

In accordance with an embodiment of the present invention, a semiconductor device includes: a write path control block including a first power gating circuit coupled to a supply terminal of a first voltage and a second power gating circuit coupled to a supply terminal of a second voltage, the write path control block suitable for generating a write control signal using the first and second voltages in a write mode; a write driving block including a third power gating circuit coupled to any one of the supply terminal of the first voltage and the supply terminal of the second voltage, the write driving block suitable for transmitting a data signal to a data input/output line using the first and second voltages based on the write control signal; and a memory block, coupled to the data input/output line, suitable for writing or reading the data signal.

In accordance with an embodiment of the present invention, a semiconductor system includes: a control device suitable for generating a system control signal; and a semiconductor device including a first power gating circuit, and suitable for minimizing a leakage current by disabling the first power gating circuit based on the system control signal.

In accordance with an embodiment of the present invention, a semiconductor system includes: a control device suitable for generating a system control signal; and a semiconductor device including first to third power gating circuits, and suitable for minimizing a leakage current by disabling the first power gating circuit based on the system control signal, and the semiconductor device includes: a data input/output control block including the first power gating circuit coupled to a supply terminal of a first voltage and the second power gating circuit coupled to a supply terminal of a second voltage, the data input/output control block suitable for generating a control signal using the first and second voltages; a data input/output block including the third power gating circuit coupled to any one of the supply terminal of the first voltage and the supply terminal of the second voltage, the data input/output block suitable for inputting and outputting a data signal using the first and second voltages based on the control signal; and a memory block, coupled to the data input/output block, suitable for writing or reading the data signal.

DETAILED DESCRIPTION

Various embodiments of the present invention are described below in more detail with reference to the accompanying drawings. These embodiments are provided so that this disclosure is thorough and complete. All "embodiments" referred to in this disclosure refer to embodiments of the inventive concept disclosed herein. The embodiments presented are merely examples and are not intended to limit the scope of the invention. Throughout the specification, reference to "an embodiment, "another embodiment" or the like is not necessarily to only one embodiment, and different references to any such phrase are not necessarily to the same embodiment(s).

Moreover, it is noted that the terminology used herein is for the purpose of describing the embodiments and is not intended to be limiting of the invention. As used herein, singular forms are intended to include the plural forms and vice versa, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component. Communication between two elements, whether directly or indirectly connected/coupled, may be wired or wireless, unless the context indicates otherwise.

It will be understood that, although the terms "first", "second", "third", and so on may be used herein to identify various elements, these elements are not limited by these terms. These terms are used to distinguish one element from another element that otherwise have the same or similar names. Thus, a first element in one instance could be termed a second or third element in another instance without departing from the spirit and scope of the present invention.

The drawings are not necessarily to scale and, in some instances, proportions may have been exaggerated in order to clearly illustrate features of the embodiments.

Figure 1A:
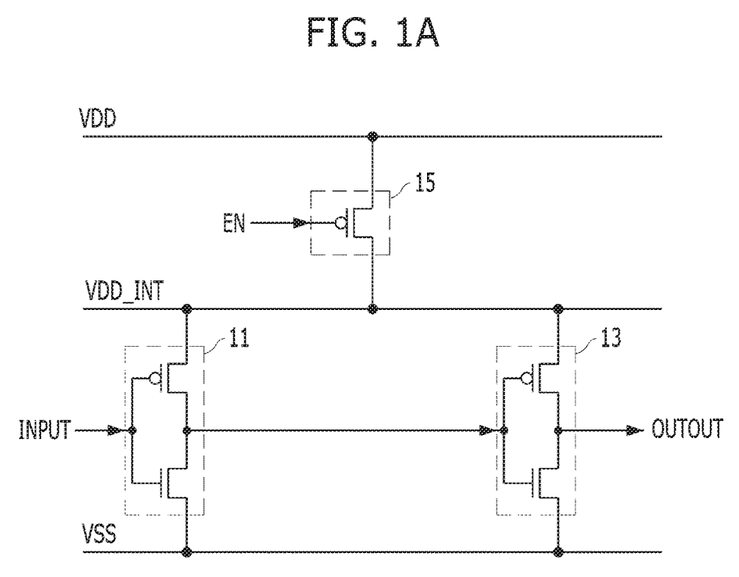
FIG. 1A is a block diagram illustrating an example of a power gating structure.
Figure 1B:
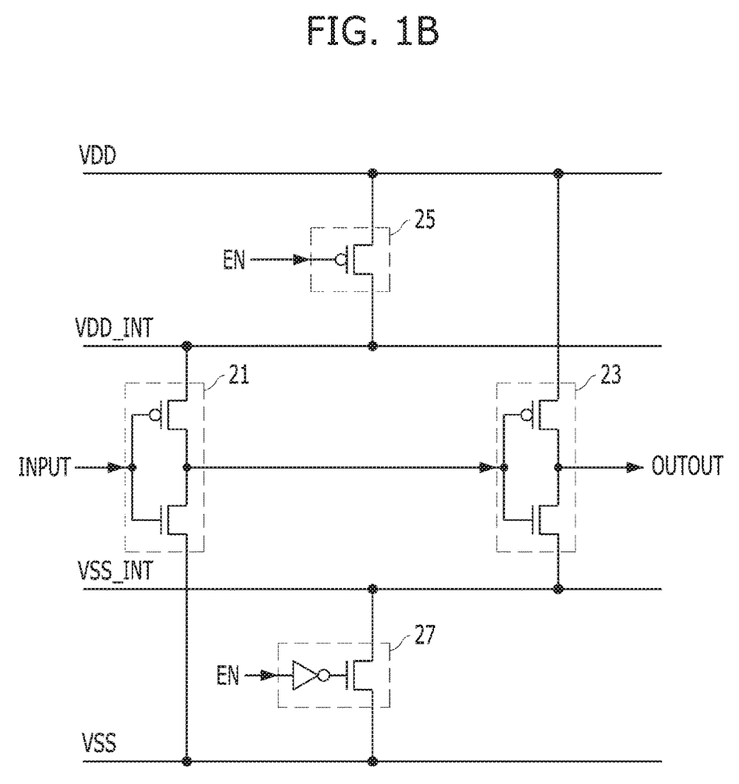
FIG. 1B is a block diagram illustrating another example of a power gating structure.

FIGS. 1A and 1B are block diagrams illustrating examples of power gating structures applied to embodiments of the present invention.

FIG. 1A is a block diagram illustrating a header-only type of power gating structure. FIG. 1B is a block diagram illustrating a zigzag type of power gating structure.

Referring to FIG. 1A, the header-only type of power gating structure may be designed so that a power source voltage VDD is selectively supplied to first and second logic circuits 11 and 13 and a ground voltage VSS is continuously supplied to the first and second logic circuits 11 and 13.

To this end, the header-only type of power gating structure may include, in addition to the first and second logic circuits 11 and 13, a power gating circuit 15. The power gating circuit 15 may be coupled between a supply terminal of the power source voltage VDD and a supply terminal of a high voltage VDD_INT. The first and second logic circuits 11 and 13 may be coupled between the supply terminal of the high voltage VDD_INT and a supply terminal of the ground voltage VSS.

The power gating circuit 15 may electrically connect the supply terminal of the power source voltage VDD to, or disconnect such supply terminal from, the supply terminal of the high voltage VDD_INT based on an enable signal EN. For example, the power gating circuit 15 may electrically connect the supply terminal of the power source voltage VDD to the supply terminal of the high voltage VDD_INT when the enable signal EN is deactivated. Further, the power gating circuit 15 may electrically disconnect the supply terminal of the power source voltage VDD from the supply terminal of the high voltage VDD_INT when the enable signal EN is activated.

The first and second logic circuits 11 and 13 may perform logic operations based on the power source voltage VDD supplied through the power gating circuit 15 and the ground voltage VSS supplied directly.

Although FIG. 1A illustrates, as an example, one power gating circuit 15 and two logic circuits 11 and 13, the present invention is not limited to this configuration.

The header-only type of power gating structure having the aforementioned structure may minimize area consumption, performance deterioration and signal distortion caused by the power gating circuit 15. Therefore, in an embodiment of the present invention, the header-only type of power gating structure may be applied to a data path.

Referring to FIG. 1B, the zigzag type of power gating structure may be designed so that a power source voltage VDD is selectively supplied to a first logic circuit 21 and the ground voltage VSS is continuously supplied to the first logic circuit 21, and the power source voltage VDD is continuously supplied to a second logic circuit 23 and the ground voltage VSS is selectively supplied to the second logic circuit 23.

To this end, the zigzag type of power gating structure may include, in addition to the first and second logic circuits 21 and 23, a first power gating circuit 25 and a second power gating circuit 27.

The first power gating circuit 25 may be coupled between a supply terminal of the power source voltage VDD and a supply terminal of a high voltage VDD_INT. The second power gating circuit 27 may be coupled a supply terminal of the ground voltage VSS and a supply terminal of a low voltage VSS_INT. The first logic circuit 21 may be coupled between the supply terminal of the high voltage VDD_INT and the supply terminal of the ground voltage VSS. The second logic circuit 23 may be coupled between the supply terminal of the power source voltage VDD and the supply terminal of the low voltage VSS_INT.

The first power gating circuit 25 may electrically connect the supply terminal of the power source voltage VDD to, or disconnect such supply terminal from, the supply terminal of the high voltage VDD_INT based on an enable signal EN. For example, the first power gating circuit 25 may electrically connect the supply terminal of the power source voltage VDD to the supply terminal of the high voltage VDD_INT when the enable signal EN is deactivated. Further, the first power gating circuit 25 may electrically disconnect the supply terminal of the power source voltage VDD from the supply terminal of the high voltage VDD_INT when the enable signal is activated.

The second power gating circuit 27 may electrically connect the supply terminal of the low voltage VSS_INT to, or disconnect such supply terminal from, the supply terminal of the ground voltage VSS based on the enable signal EN. For example, the second power gating circuit 27 may electrically connect the supply terminal of the low voltage VSS_INT to the supply terminal of the ground voltage VSS based on the deactivated enable signal EN. Further, the second power gating circuit 27 may electrically disconnect the supply terminal of the low voltage VSS_INT from the supply terminal of the ground voltage VSS based on the activated enable signal EN.

The first logic circuit 21 may perform a logic operation based on the power source voltage VDD supplied through the first power gating circuit 25 and the ground voltage VSS supplied directly.

The second logic circuit 23 may perform a logic operation based on the power source voltage VDD supplied directly and the ground voltage VSS supplied through the second power gating circuit 27.

Although FIG. 1B illustrates, as an example, one first power gating circuit 25, one second power gating circuit 27 and two logic circuits 21 and 23, the present invention is not limited to this configuration.

The zigzag type of power gating structure having the aforementioned structure may decrease a leakage current on a level similar to the header-only type of power gating structure while a logic state of an output terminal may be maintained without floating depending on a logic state of an input terminal in a set mode. Therefore, in an embodiment of the present invention, the zigzag type of power gating structure may be applied to a control path.

Figure 2:
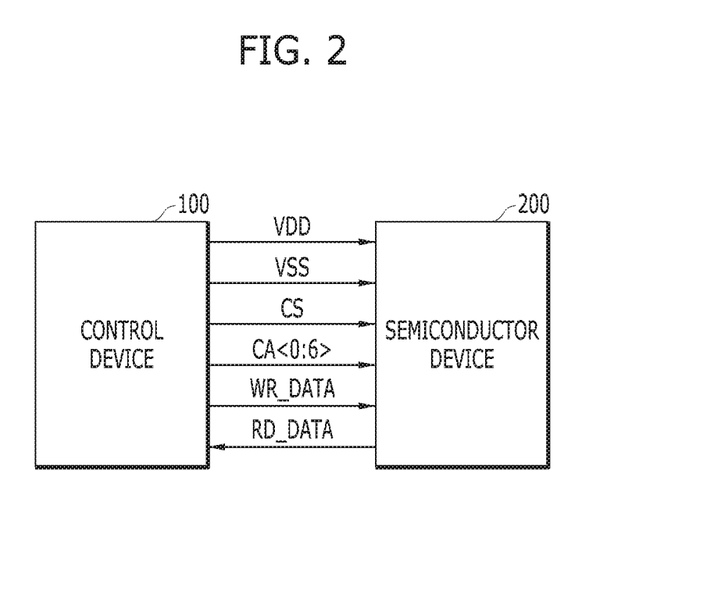
FIG. 2 is a block diagram illustrating a semiconductor system in accordance with an embodiment of the present invention.

FIG. 2 is a block diagram illustrating a semiconductor system in accordance with an embodiment of the present invention.

Referring to FIG. 2, the semiconductor system may include a control device 100 and a semiconductor device 200.

The control device 100 may output system control signals CS and CA<0:6> to the semiconductor device 200 based on the mode in which the semiconductor device 200 is in. The mode may include any one of a power-down mode PDE, an active mode ACT, a write mode WR and a read mode RD. The system control signals CS and CA<0:6> may include a chip selection signal CS and first to seventh command/address signals CA<0:6>. The system control signals CS and CA<0:6> corresponding to the respective modes may be generated as shown in the following Table 1.

TABLE 1

|     | CS | CA<0> | CA<1> | CA<2> | CA<3> | CA<4> | CA<5> | CA<6> |
|-----|----|-------|-------|-------|-------|-------|-------|-------|
| PDE | H  | L     | L     | L     | L     | L     | L     | H     |
| WR  | H  | L     | H     | H     | C2    | C3    | C4    | C5    |
| RD  | H  | H     | L     | B3    | C2    | C3    | C4    | C5    |

As shown in Table 1, the control device 100 may operate in the mode through a combination of all or some of the system control signals CS and CA<0:6>. For example, according to the power-down mode PDE, the control device 100 may generate the chip selection signal CS having a logic high level H, the first command/address signal CA<0> having a logic low level L, the second command/address signal CA<1> having the logic low level L, the third command/address signal CA<2> having the logic low level L, the fourth command/address signal CA<3> having the logic low level L, the fifth command/address signal CA<4> having the logic low level L, the sixth command/address signal CA<5> having the logic low level L and the seventh command/address signal CA<6> having the logic high level H. According to the write mode WR, the control device 100 may generate the chip selection signal CS having the logic high level H, the first command/address signal CA<0> having the logic low level L, the second command/address signal CA<1> having the logic high level H and the third command/address signal CA<2> having the logic high level H. In this case, the control device 100 may generate the fourth to seventh command/address signals CA<3:6> having specific information C2, C3, C4 and C5 together according to the write mode WR. Each of the specific information C2, C3, C4 and C5 may include address information required for the write mode WR or information for other function. According to the read mode RD, the control device 100 may generate the chip selection signal CS having the logic high level H, the first command/address signal CA<0> having the logic high level H and the second command/address signal CA<1> having the logic low level L. In this case, the control device 100 may generate the third to seventh command/address signals CA<2:6> having specific information B3, C2, C3, C4 and C5 together according to the read mode RD. Each of the specific information B3, C2, C3, C4 and C5 may include address information required for the read mode RD and information for other function.

Although it is described above that the modes include the power-down mode PDE, the write mode WR or the read mode RD, the present invention is not limited to this.

The control device 100 may output a write data signal WR_DATA to the semiconductor device 200 in the write mode WR. Further, the control device 100 may receive a read data signal RD_DATA from the semiconductor device 200 in the read mode RD.

The control device 100 may supply a power source voltage VDD and a ground voltage VSS to the semiconductor device 200.

The semiconductor device 200 may perform the power gating operation based on the system control signals CS and CA<0:6> when entering a particular mode. For example, the semiconductor device 200 may include a power gating circuit, and may disable the power gating circuit when entering a particular mode, which will be described in detail below.

Figure 3:
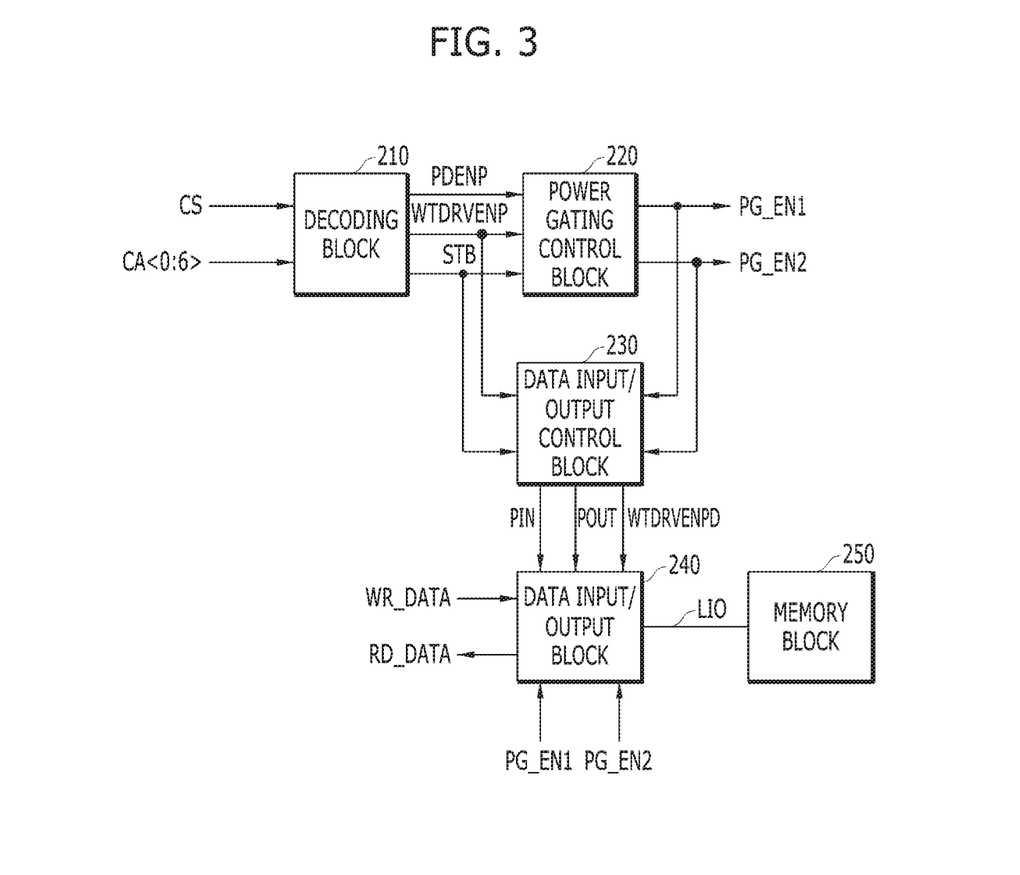
FIG. 3 is a block diagram illustrating a semiconductor device, such as that shown in FIG. 2, in accordance with an embodiment of the present invention.

FIG. 3 is a block diagram illustrating a semiconductor device, e.g., the semiconductor device 200 shown in FIG. 2, in accordance with an embodiment of the present invention.

Referring to FIG. 3, the semiconductor device 200 may include a decoding block 210, a power gating control block 220, a data input/output control block 230, a data input/output block 240, and a memory block 250.

The decoding block 210 may generate enable signals PDENP, WTDRVENP and STB according to the set mode based on the system control signals CS and CA<0:6>. For example, the decoding block 210 may activate a power-down enable signal PDENP during a power-down period corresponding to the power-down mode PDE when a combination of the system control signals CS and CA<0:6> represents the power-down mode PDE. The decoding block 210 may activate a write enable signal WTDRVENP during a write period corresponding to the write mode WR when a combination of some signals CS and CS<0:2> of the system control signals CS and CA<0:6> represents the write mode WR. The decoding block 210 may activate a read enable signal STB during a read period corresponding to the read mode RD when a combination of some signals CS and CS<0:1> of the system control signals CS and CA<0:6> represents the read mode RD.

The power gating control block 220 may generate first and second enable signals PG_EN1 and PG_EN2 for controlling the power gating operation according to the set mode based on the power-down enable signal PDENP, the write enable signal WTDRVENP and the read enable signal STB. For example, the power gating control block 220 may activate the first and second enable signals PG_EN1 and PG_EN2 during the power-down period based on the power-down enable signal PDENP which is activated. The power gating control block 220 may activate the first enable signal PG_EN1 and deactivate the second enable signal PG_EN2 during the write period based on the write enable signal WTDRVENP which is activated. The power gating control block 220 may activate the second enable signal PG_EN2 and deactivate the first enable signal PG_EN1 during the read period based on the read enable signal STB which is activated.

The data input/output control block 230 may generate control signals PIN, POUT and WTDRVENPD based on the write enable signal WTDRVENP, the read enable signal STB and the first and second enable signals PG_EN1 and PG_EN2. First and second read control signals PIN and POUT may be related to the read mode RD, and a write control signal WTDRVENPD may be related to the write mode WR.

The data input/output block 240 may receive the write data signal WR_DATA and output the read data signal RD_DATA based on the control signals PIN, POUT and WTDRVENPD and the first and second enable signals PG_EN1 and PG_EN2.

The memory block 250 may be coupled to the data input/output block 240 through a local input/output line LIO. The memory block 250 may write a data signal, which corresponds to the write data signal WR_DATA, received through the local input/output line LIO and read a data signal, which corresponds to the read data signal RD_DATA, through the local input/output line LIO.

Figure 4:
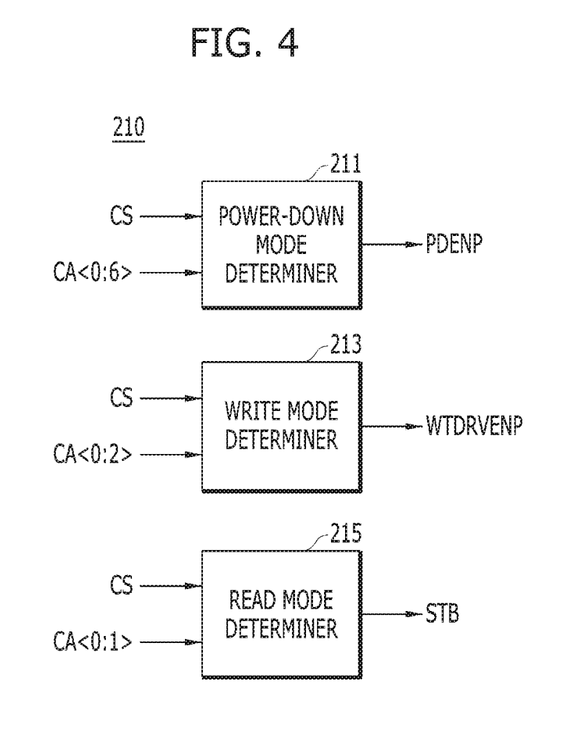
FIG. 4 is a block diagram illustrating a decoding block, such as that shown in FIG. 3, in accordance with an embodiment of the present invention.

FIG. 4 is a block diagram illustrating a decoding block, e.g., the decoding block 210 shown in FIG. 3, in accordance with an embodiment of the present invention.

Referring to FIG. 4, the decoding block 210 may include a power-down mode determiner 211, a write mode determiner 213, and a read mode determiner 215.

The power-down mode determiner 211 may generate the power-down enable signal PDENP, which is activated during the power-down period and deactivated during the read period, based on the system control signals CS and CA<0:6>. For example, the power-down mode determiner 211 may activate the power-down enable signal PDENP to a logic high level during the power-down period and deactivate the power-down enable signal PDENP to a logic low level during the write and read periods.

The write mode determiner 213 may generate the write enable signal WTDRVENP, which is activated during the write period and deactivated during the power-down period and the read period, based on some signals CS and CA<0:2> of the system control signals CS and CA<0:6>. For example, the write mode determiner 213 may activate the write enable signal WTDRVENP to a logic high level during the write period and deactivate the write enable signal WTDRVENP to a logic low level during the power-down period and the read period.

The read mode determiner 215 may generate the read enable signal STB, which is activated during the read period and deactivated during the power-down period and the write period, based on some signals CS and CA<0:1> of the system control signals CS and CA<0:6>. For example, the read mode determiner 215 may activate the read enable signal STB to a logic high level during the read period and deactivate the read enable signal STB to a logic low level during the power-down period and the write period.

Figure 5:
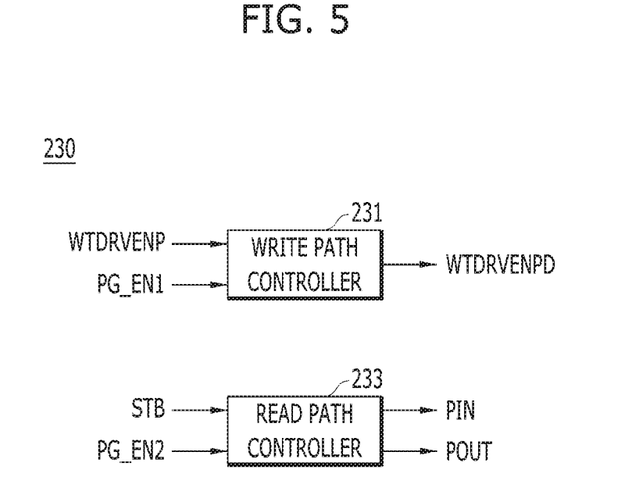
FIG. 5 is a block diagram illustrating a data input/output control block, such as that shown in FIG. 3, in accordance with an embodiment of the present invention.

FIG. 5 is a block diagram illustrating a data input/output control block, e.g., the data input/output control block 230 shown in FIG. 3, in accordance with an embodiment of the present invention.

Referring to FIG. 5, the data input/output control block 230 may include a write path controller 231, and a read path controller 233.

The write path controller 231 may generate the write control signal WTDRVENPD based on the write enable signal WTDRVENP and the first enable signal PG_EN1. For example, the write path controller 231 may activate the write control signal WTDRVENPD during the write period and deactivate the write control signal WTDRVENPD during the read period and the power-down period.

The read path controller 233 may generate the first and second read control signals PIN and POUT based on the read enable signal STB and the second enable signal PG_EN2. For example, the read path controller 233 may activate the first and second read control signals PIN and POUT during the read period and deactivate the first and second read control signals PIN and POUT during the write period and the power-down period.

Figure 6:
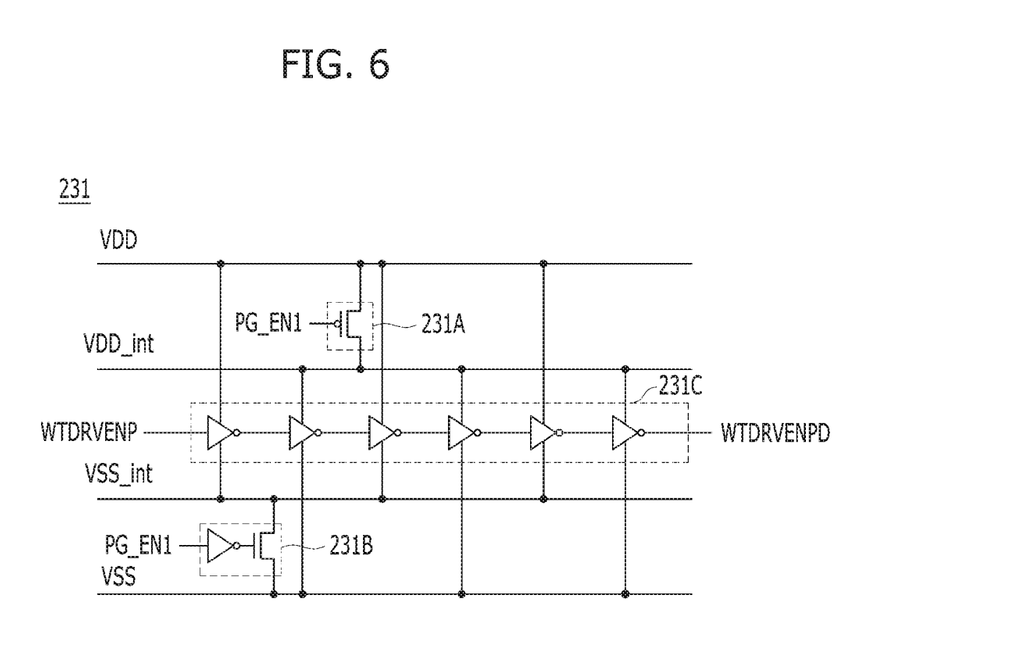
FIG. 6 is a diagram illustrating a write path controller, such as that shown in FIG. 5, in accordance with an embodiment of the present invention.

FIG. 6 is a diagram illustrating a write path control, e.g., the write path controller 231 shown in FIG. 5, in accordance with an embodiment of the present invention.

Referring to FIG. 6, the write path controller 231 may include a first power gating circuit 231A, a second power gating circuit 231B, and a first logic circuit 231C. In other words, the write path controller 231 may have the zigzag type of power gating structure.

The first power gating circuit 231A may be coupled between a supply terminal of the power source voltage VDD and a supply terminal of a high voltage VDD_int. The first power gating circuit 231A may electrically connect the supply terminal of the power source voltage VDD to, or disconnect such supply terminal from, the supply terminal of the high voltage VDD_int based on the first enable signal PG_EN1. When the supply terminal of the power source voltage VDD is electrically connected to the supply terminal of the high voltage VDD_int through the first power gating circuit 231A, the supply terminal of the high voltage VDD_int may have almost the same voltage level as the power source voltage VDD. For example, the high voltage VDD_int may correspond to a difference between the power source voltage VDD and a threshold voltage of a transistor included in the first power gating circuit 231A. When the supply terminal of the power source voltage VDD is electrically disconnected from the supply terminal of the high voltage VDD_int by the first power gating circuit 231A, the supply terminal of the high voltage VDD_int may be in a floating state.

The second power gating circuit 231B may be coupled between a supply terminal of the ground voltage VSS and a supply terminal of a low voltage VSS_int. The second power gating circuit 231B may electrically connect the supply terminal of the ground voltage VSS to, or disconnect such supply terminal from, the supply terminal of the low voltage VSS_int based on the first enable signal PG_EN1. When the supply terminal of the ground voltage VSS is electrically connected to the supply terminal of the low voltage VSS_int through the second power gating circuit 231B, the supply terminal of the low voltage VSS_int may have almost the same voltage level as the ground voltage VSS. For example, the low voltage VSS_int may correspond to a difference between the ground voltage VSS and a threshold voltage of a transistor included in the second power gating circuit 231B. When the supply terminal of the ground voltage VSS is electrically disconnected from the supply terminal of the low voltage VSS_int by the second power gating circuit 231B, the supply terminal of the low voltage VSS_int may be in a floating state.

The first logic circuit 231C may be coupled to the supply terminal of the power source voltage VDD, the supply terminal of the ground voltage VSS, the supply terminal of the high voltage VDD_int and the supply terminal of the low voltage VSS_int. For example, the first logic circuit 231C may include a plurality of logic elements, for example, an inverter, that are coupled in series to each other. Odd-numbered logic elements of the logic elements may be coupled between the supply terminal of the power source voltage VDD and the supply terminal of the low voltage VSS_int. Even-numbered logic elements of the logic elements may be coupled between the supply terminal of the high voltage VDD_int and the supply terminal of the ground voltage VSS. The first logic circuit 231C may delay the write enable signal WTDRVENP by a set delay time to generate the write control signal WTDRVENPD. In other words, the first logic circuit 231C may generate the write control signal WTDRVENPD which is activated after the write enable signal WTDRVENP is activated and the delay time passes, during the write period. In addition, the first logic circuit 231C may generate the write control signal WTDRVENPD which is deactivated based on the write enable signal WTDRVENP which is deactivated, during the read period and the power-down period. The write control signal WTDRVENPD may be kept in a deactivated state during the read period and the power-down period because the plurality of logic elements included in the first logic circuit 231C are coupled in the zigzag type between the supply terminal of the power source voltage VDD and the supply terminal of the ground voltage VSS.

Figure 7:
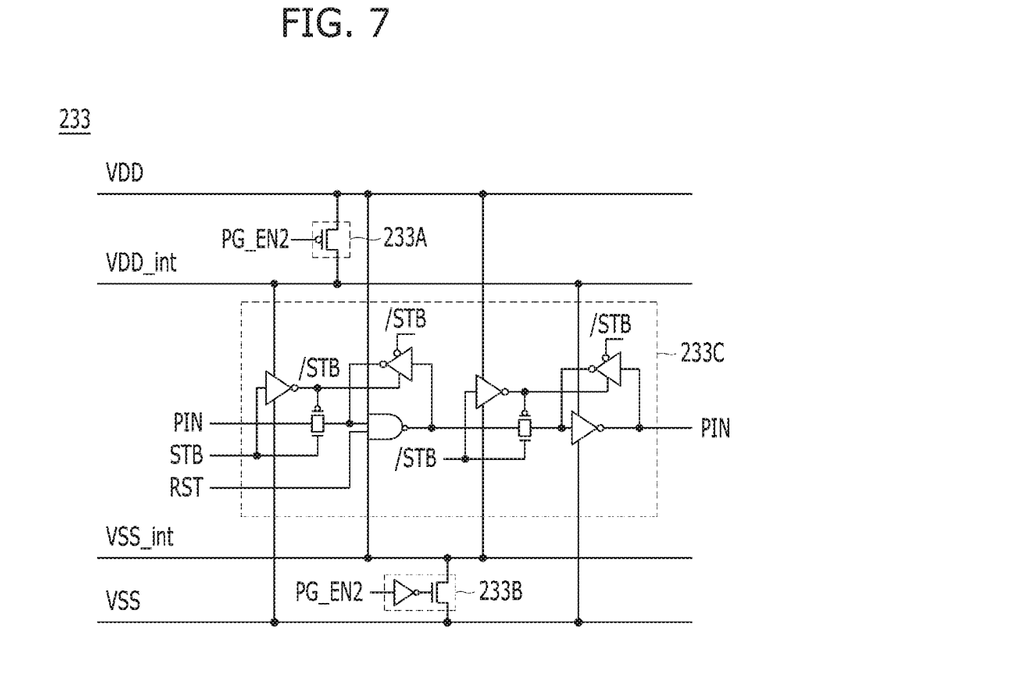
FIG. 7 is a diagram illustrating a read path controller, such as that shown in FIG. 5, in accordance with an embodiment of the present invention.

FIG. 7 is a diagram illustrating a read path control, e.g., the read path control 233 shown in FIG. 5, in accordance with an embodiment of the present invention. For clarity, FIG. 7 illustrates just a circuit for generating the first read control signal PIN.

Referring to FIG. 7, the read path controller 233 may include a third power gating circuit 233A, a fourth power gating circuit 233B, and a second logic circuit 233C. In other words, the read path controller 233 may have the zigzag type of power gating structure.

The third power gating circuit 233A may be coupled between the supply terminal of the power source voltage VDD and the supply terminal of the high voltage VDD_int. The third power gating circuit 233A may electrically connect the supply terminal of the power source voltage VDD to, or disconnect such supply terminal from, the supply terminal of the high voltage VDD_int based on the second enable signal PG_EN2. When the supply terminal of the power source voltage VDD is electrically connected to the supply terminal of the high voltage VDD_int through the third power gating circuit 233A, the supply terminal of the high voltage VDD_int may have almost the same voltage level as the power source voltage VDD. For example, the high voltage VDD_int may correspond to a difference between the power source voltage VDD and a threshold voltage of a transistor included in the third power gating circuit 233A. When the supply terminal of the power source voltage VDD is electrically disconnected from the supply terminal of the high voltage VDD_int by the third power gating circuit 233A, the supply terminal of the high voltage VDD_int may be in a floating state.

The fourth power gating circuit 233B may be coupled between the supply terminal of the ground voltage VSS and the supply terminal of the low voltage VSS_int. The fourth power gating circuit 233B may electrically connect the supply terminal of the ground voltage VSS to, or disconnect such supply terminal from, the supply terminal of the low voltage VSS_int based on the second enable signal PG_EN2. When the supply terminal of the ground voltage VSS is electrically connected to the supply terminal of the low voltage VSS_int through the fourth power gating circuit 233B, the supply terminal of the low voltage VSS_int may have almost the same voltage level as the ground voltage VSS. For example, the low voltage VSS_int may correspond to a difference between the ground voltage VSS and a threshold voltage of a transistor included in the fourth power gating circuit 233B. When the supply terminal of the ground voltage VSS is electrically disconnected from the supply terminal of the low voltage VSS_int by the fourth power gating circuit 233B, the supply terminal of the low voltage VSS_int may be in a floating state.

The second logic circuit 233C may be coupled to the supply terminal of the power source voltage VDD, the supply terminal of the ground voltage VSS, the supply terminal of the high voltage VDD_int and the supply terminal of the low voltage VSS_int. For example, the second logic circuit 233C may include a generation path of the first read control signal PIN. The generation path of the first read control signal PIN may include a plurality of logic elements, for example, a NAND gate and an inverter, that are coupled in series to each other. Odd-numbered logic elements, for example, the NAND gate, of the logic elements may be coupled between the supply terminal of the power source voltage VDD and the supply terminal of the low voltage VSS_int. Even-numbered logic elements, for example, the inverter, of the logic elements may be coupled between the supply terminal of the high voltage VDD_int and the supply terminal of the ground voltage VSS. In addition, the second logic circuit 233C may include an input path of the read enable signal STB. The input path of the read enable signal STB may include a plurality of logic elements, for example, an inverter. Odd-numbered logic elements of the logic elements may be coupled between the supply terminal of the high voltage VDD_int and the supply terminal of the ground voltage VSS. Even-numbered logic elements of the logic elements may be coupled between the supply terminal of the power source voltage VDD and the supply terminal of the low voltage VSS_int. The second logic circuit 233C may generate the first read control signal PIN based on the read enable signal STB. For example, the second logic circuit 233C may latch and output the first read control signal PIN based on the read enable signal STB.

Although not illustrated, the read path controller 233 may include a circuit for generating the second read control signal POUT, which may have the zigzag type of power gating structure as described above.

Figure 8:
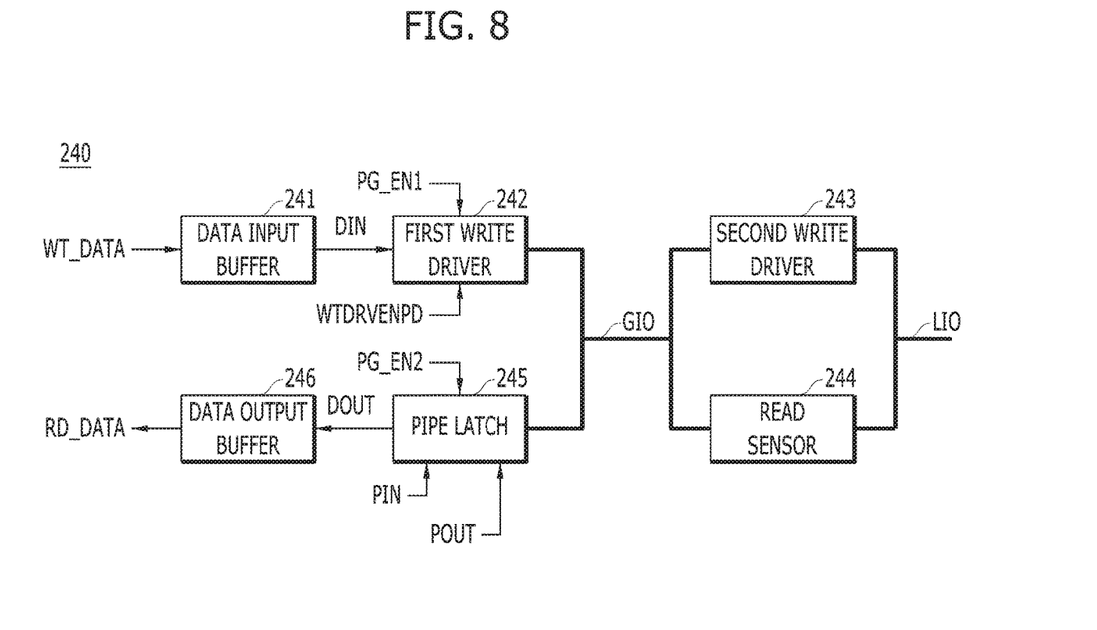
FIG. 8 is a block diagram illustrating a data input/output block, such as that shown in FIG. 3, in accordance with an embodiment of the present invention.

FIG. 8 is a block diagram illustrating a data input/output block, e.g., the data input/output block 240 shown in FIG. 3, in accordance with an embodiment of the present invention.

Referring to FIG. 8, the data input/output block 240 may include data input paths 241, 242 and 243 which refer to data write paths, and data output paths 244, 245 and 246 which refer to data read paths.

The data input paths may be enabled in the write mode WR, and may include a data input buffer 241, a first write driver 242, and a second write driver 243. The data input buffer 241 may output an input data signal DIN based on the write data signal WR_DATA. The first write driver 242 may receive the input data signal DIN, and transmit the input data signal DIN to a global input/output line GIO based on the write control signal WTDRVENPD and the first enable signal PG_EN1. The second write driver 243 may transmit the data signal received through the global input/output line GIO to the memory block 250 of FIG. 3 through the local input/output line LIO.

The data output paths may be enabled in the read mode RD, and may include a read sensor 244, a pipe latch 245, and a data output buffer 246. The read sensor 244 may transmit the data signal read from the memory block 250 through the local input/output line LIO to the global input/output line GIO. The pipe latch 245 may latch the data signal received through the global input/output line GIO based on the first read control signal PIN, the second read control signal POUT and the second enable signal PG_EN2. The data output buffer 246 may output the read data signal RD_DATA based on an output data signal DOUT latched in the pipe latch 245.

Figure 9:
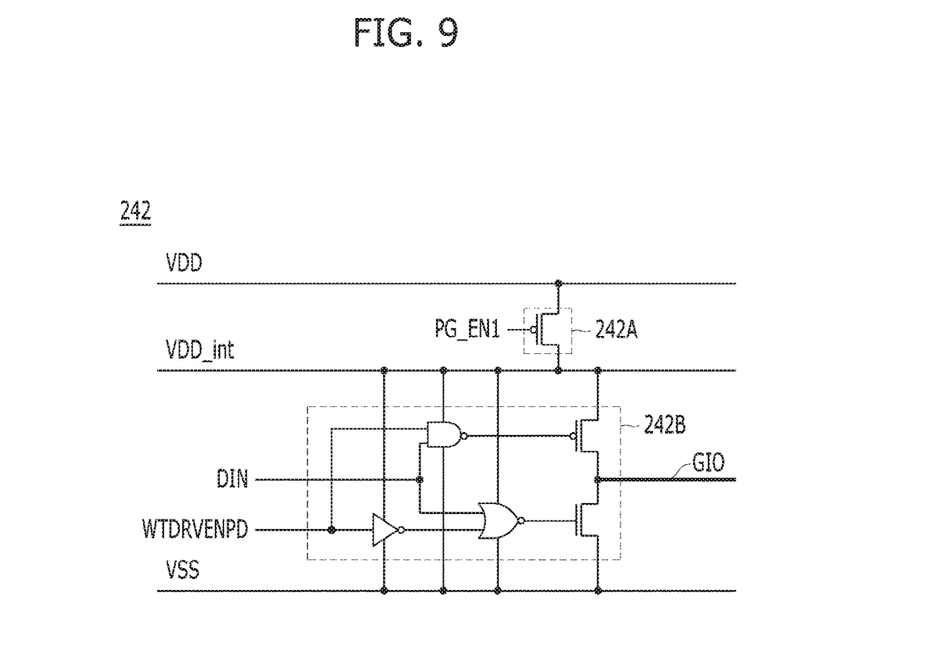
FIG. 9 is a diagram illustrating a first write driver, such as that shown in FIG. 8, in accordance with an embodiment of the present invention.

FIG. 9 is a diagram illustrating a first write driver, e.g., the first write driver 242 shown in FIG. 8, in accordance with an embodiment of the present invention.

Referring to FIG. 9, the first write driver 242 may include a fifth power gating circuit 242A, and a third logic circuit 242B. In other words, the first write driver 242 may have the header-only type of power gating structure.

The fifth power gating circuit 242A may be coupled between the supply terminal of the power source voltage VDD and the supply terminal of the high voltage VDD_int. The fifth power gating circuit 242A may electrically connect the supply terminal of the power source voltage VDD to, or disconnect such supply terminal from, the supply terminal of the high voltage VDD_int based on the first enable signal PG_EN1. When the supply terminal of the power source voltage VDD is electrically connected to the supply terminal of the high voltage VDD_int through the fifth power gating circuit 242A, the supply terminal of the high voltage VDD_int may have almost the same voltage level as the power source voltage VDD. For example, the high voltage VDD_int may correspond to a difference between the power source voltage VDD and a threshold voltage of a transistor included in the fifth power gating circuit 242A. When the supply terminal of the power source voltage VDD is electrically disconnected from the supply terminal of the high voltage VDD_int by the fifth power gating circuit 242A, the supply terminal of the high voltage VDD_int may be in a floating state.

The third logic circuit 242B may be coupled between the supply terminal of the high voltage VDD_int and the supply terminal of the ground voltage VSS. The third logic circuit 242B may drive the global input/output line GIG with the high voltage VDD_int or the ground voltage VSS based on the input data signal DIN and the write control signal WTDRVENPD.

Figure 10:
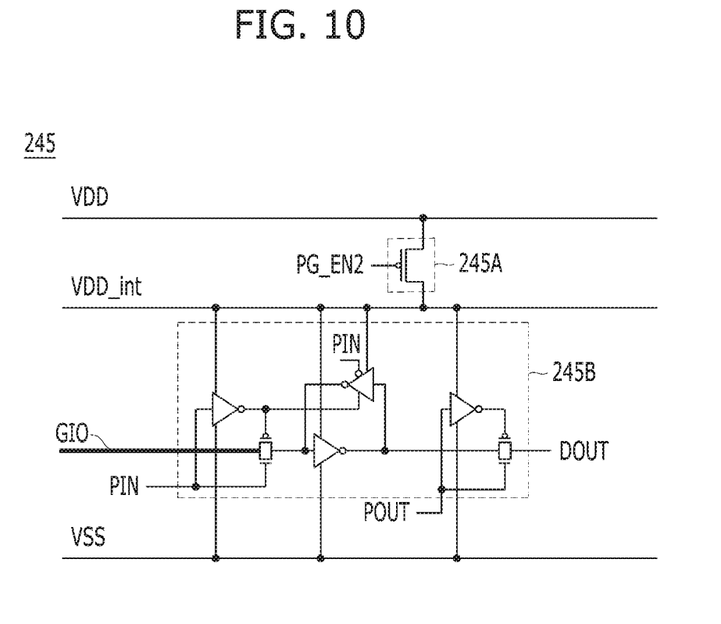
FIG. 10 is a diagram illustrating a pipe latch, such as that shown in FIG. 8, in accordance with an embodiment of the present invention.

FIG. 10 is a diagram illustrating a pipe latch, e.g., the pipe latch 245 shown in FIG. 8, in accordance with an embodiment of the present invention.

Referring to FIG. 10, the pipe latch 245 may include a sixth power gating circuit 245A, and a fourth logic circuit 245B. In other words, the pipe latch 245 may have the header-only type of power gating structure.

The sixth power gating circuit 245A may be coupled between the supply terminal of the power source voltage VDD and the supply terminal of the high voltage VDD_int. The sixth power gating circuit 245A may electrically connect the supply terminal of the power source voltage VDD to, or disconnect such supply terminal from, the supply terminal of the high voltage VDD_int based on the second enable signal PG_EN2. When the supply terminal of the power source voltage VDD is electrically connected to the supply terminal of the high voltage VDD_int through the sixth power gating circuit 245A, the supply terminal of the high voltage VDD_int may have almost the same voltage level as the power source voltage VDD. For example, the high voltage VDD_int may correspond to a difference between the power source voltage VDD and a threshold voltage of a transistor included in the sixth power gating circuit 245A. When the supply terminal of the power source voltage VDD is electrically disconnected from the supply terminal of the high voltage VDD_int by the sixth power gating circuit 245A, the supply terminal of the high voltage VDD_int may be in a floating state.

The fourth logic circuit 245B may be coupled between the supply terminal of the high voltage VDD_int and the supply terminal of the ground voltage VSS. The fourth logic circuit 245B may latch the data signal received through the global input/output line GI© based on the first read control signal PIN, and output the latched data signal as the output data signal DOUT based on the second read control signal POUT.

Hereinafter, an operation of the semiconductor system having the aforementioned structure is described.

First, an operation of the semiconductor system corresponding to the power-down mode PDE is described.

The control device 100 of FIG. 2 may generate the system control signals CS and CA<0:6> corresponding to the power-down mode PDE.

The semiconductor device 200 may internally control the power gating operation based on the system control signals CS and CA<0:6> when entering the power-down mode PDE. For example, the decoding block 210 of FIG. 3 may activate the power-down enable signal PDENP based on the system control signals CS and CA<0:6> during the power-down period. The power gating control block 220 may activate the first and second enable signals PG_EN1 and PG_EN2 based on the activated power-down enable signal PDENP. As shown in FIGS. 5 to 7, each of the first to fourth power gating circuits 231A, 231B, 233A and 233B included in the data input/output control block 230 may be disabled based on the first enable signal PG_EN1 or the second enable signal PG_EN2 during the power-down period. As shown in FIGS. 8 to 10, each of the fifth and sixth power gating circuits 242A and 245A included in the data input/output block 240 may be disabled based on the first enable signal PG_EN1 or the second enable signal PG_EN2 during the power-down period.

Accordingly, a leakage current caused by the data input/output control block 230 and the data input/output block 240 in the power-down mode PDE may be minimized.

Next, an operation of the semiconductor system corresponding to the write mode WR is described.

The control device 100 of FIG. 2 may generate the system control signals CS and CA<0:6> corresponding to the write mode WR.

The semiconductor device 200 may internally control the power gating operation based on the system control signals CS and CA<0:6> when entering the write mode WR. For example, the decoding block 210 of FIG. 3 may activate the write enable signal WTDRVENP based on the system control signals CS and CA<0:6> during the write period. The power gating control block 220 may deactivate the first enable signal PG_EN1 and activate the second enable signal PG_EN2 based on the activated write enable signal WTDRVENP. As shown in FIGS. 5 to 7, the first and second power gating circuits 231A and 231B included in the data input/output control block 230 may be enabled based on the first enable signal PG_EN1 during the write period, and the third and fourth power gating circuits 233A and 233B included in the data input/output control block 230 may be disabled based on the second enable signal PG_EN2 during the write period. As shown in FIGS. 8 to 10, the fifth power gating circuit 242A included in the data input/output block 240 may be enabled based on the first enable signal PG_EN1 during the write period, and the sixth power gating circuit 245A included in the data input/output block 240 may be disabled based on the second enable signal PG_EN2 during the write period.

Accordingly, in the write mode WR, as the first write driver 242 has the power gating structure in which performance deterioration caused by the fifth power gating circuit 242A is almost negligible, a high-speed write operation and a reliable write operation may be realized. Further, a leakage current generated by the read path controller 233 and the pipe latch 245 in the write mode WR may be minimized.

Finally, an operation of the semiconductor system corresponding to the read mode RD is described.

The control device 100 of FIG. 2 may generate the system control signals CS and CA<0:6> corresponding to the read mode RD.

The semiconductor device 200 may internally control the power gating operation based on the system control signals CS and CA<0:6> when entering the read mode RD. For example, the decoding block 210 of FIG. 3 may activate the read enable signal STB based on the system control signals CS and CA<0:6> during the read period. The power gating control block 220 may activate the first enable signal PG_EN1 and deactivate the second enable signal PG_EN2 based on the activated read enable signal STB. As shown in FIGS. 5 to 7, the first and second power gating circuits 231A and 231B included in the data input/output control block 230 may be disabled based on the first enable signal PG_EN1 during the read period, and the third and fourth power gating circuits 233A and 233B included in the data input/output control block 230 may be enabled based on the second enable signal PG_EN2 during the read period. As shown in FIGS. 8 to 10, the fifth power gating circuit 242A included in the data input/output block 240 may be disabled based on the first enable signal PG_EN1 during the read period, and the sixth power gating circuit 245A included in the data input/output block 240 may be enabled based on the second enable signal PG_EN2 during the read period.

Accordingly, in the read mode RD, as the pipe latch 245 has the power gating structure in which performance deterioration caused by the sixth power gating circuit 245A is almost negligible, a high-speed read operation and a reliable read operation may be realized. Further, a leakage current generated by the write path controller 231 and the first write driver 242 in the read mode RD may be minimized.

As described above, a semiconductor device may internally control a power gating operation. Specifically, as a header-only type of power gating structure is applied to a data path of the semiconductor device and a zigzag type of power gating structure is applied to a control path of the semiconductor device, performance deterioration of a semiconductor system caused by a power gating circuit may be minimized.

In accordance with embodiments of the present invention, as the semiconductor device has a power gating structure which is optimally designed depending on intended use, an area overhead and performance deterioration caused by a power gating circuit may be minimized.

Also, in accordance with embodiments of the present invention, as a semiconductor device performs a power gating operation regardless of control of a control device, the processing amount of the control device and a power overhead may be minimized.

While the present invention has been illustrated and described with respect to specific embodiments, these embodiments are not intended to be restrictive, but rather descriptive. Further, it is noted that the present invention may be achieved in various ways through substitution, change, and modification, as would be understood by those skilled in the art, without departing from the spirit and/or scope of the present invention as defined by the following claims.

What is claimed is:

1. A semiconductor device, comprising:
 a data input/output control block having a first type of power gating structure including a first power gating circuit coupled to a supply terminal of a first voltage and a second power gating circuit coupled to a supply terminal of a second voltage, the data input/output control block suitable for generating a control signal using the first and second voltages;
 a data input/output block having a second type of power gating structure including a third power gating circuit coupled to any of the supply terminal of the first voltage and the supply terminal of the second voltage, the second type of power gating structure being different from the first type of power gating structure, the data input/output block suitable for inputting and outputting a data signal using the first and second voltages based on the control signal; and
 a memory block, coupled to the data input/output block, suitable for writing or reading the data signal.

2. The semiconductor device of claim 1, further comprising:
 a power gating control block suitable for activating an enable signal in a specific mode,
 wherein the first to third power gating circuits are disabled based on the enable signal in the specific mode.

3. The semiconductor device of claim 2, wherein the specific mode includes one of a power-down mode, a write mode and a read mode.

4. The semiconductor system of claim 1, wherein the first type of power gating structure is a zigzag type of power gating structure, and
 wherein the second type of power gating structure is a header-only type of power gating structure.

5. The semiconductor device of claim 1, wherein the data input/output control block is coupled to the data input/output block.

6. A semiconductor system, comprising:
 a control device suitable for generating a system control signal; and
 a semiconductor device including a data input/output control block having a zigzag type of power gating structure and a data input/output block having a header-only type of power gating structure, and suitable for minimizing a leakage current by disabling at least one of power gating circuits included in the power gating structures based on the system control signal.

7. The semiconductor system of claim 6, wherein the semiconductor device enters a write mode or a read mode based on the system control signal,
 wherein the data input/output control block includes:
 a first power gating circuit coupled to a supply terminal of a first voltage and suitable for being disabled when entering the write mode or the read mode;

a second power gating circuit coupled to a supply terminal of a second voltage and suitable for being disabled when entering the write mode or the read mode;
a first logic circuit coupled to the first and second power gating circuits;
a third power gating circuit coupled to the supply terminal of the first voltage and suitable for being enabled when entering the write mode or the read mode;
a fourth power gating circuit coupled to the supply terminal of the second voltage and suitable for being enabled when entering the write mode or the read mode; and
a second logic circuit coupled to the third and fourth power gating circuits.

8. The semiconductor system of claim 7, wherein the semiconductor device enters a power-down mode based on the system control signals,
wherein the first to fourth power gating circuits are disabled when entering the power-down mode.

9. The semiconductor system of claim 6, wherein the semiconductor device enters a write mode or a read mode based on the system control signals,
wherein the data input/output block includes:
a fifth power gating circuit coupled to only one of the supply terminal of the first voltage and the supply terminal of the second voltage and suitable for being disabled when entering the write mode or the read mode,
a sixth power gating circuit coupled to only one of the supply terminal of the first voltage and the supply terminal of the second voltage and suitable for being enabled when entering the write mode or the read mode,
a third logic circuit coupled to the fifth power gating circuit; and
a fourth logic circuit coupled to the sixth power gating circuit.

10. The semiconductor system of claim 9, wherein
the semiconductor device enters a power-down mode based on the system control signals,
wherein the fifth and sixth power gating circuits are disabled when entering the power-down mode.

11. The semiconductor system of claim 6, wherein the data input/output control block is coupled to the data input/output block.

12. A semiconductor system, comprising:
a control device suitable for generating a system control signal; and
a semiconductor device including first to third power gating circuits, and suitable for minimizing a leakage current by disabling the first power gating circuit based on the system control signal, and
wherein the semiconductor device, includes:
a data input/output control block having a first type of power gating structure including the first power gating circuit coupled to a supply terminal of a first voltage and the second power gating circuit coupled to a supply terminal of a second voltage, the data input/output control block suitable for generating an input/output control signal using the first and second voltages;
a data input/output block having a second type of power gating structure including the third power gating circuit coupled to any of the supply terminal of the first voltage and the supply terminal of the second voltage, the second type of power gating structure being different from the first type of power gating structure, the data input/output block suitable for inputting and outputting a data signal using the first and second voltages based on the input/output control signal; and
a memory block, coupled to the data input/output block, suitable for writing or reading the data signal.

13. The semiconductor system of claim 12, wherein the semiconductor device further includes:
a decoding block suitable for generating a first enable signal according to a specific mode based on the system control signal; and
a power gating control block suitable for generating a second enable signal according to the specific mode based on the first enable signal, and
wherein the first to third power gating circuits are disabled based on the second enable signal in the specific mode.

14. The semiconductor system of claim 13, wherein the specific mode includes one of a power-down mode, a write mode and a read mode.

15. The semiconductor system of claim 13, wherein the semiconductor device further includes fourth to sixth power gating circuits,
wherein the semiconductor device enables the fourth to sixth power gating circuits or maintains an enable state of the fourth to sixth power gating circuits, when entering the specific mode.

16. The semiconductor system of claim 12, wherein the first type of power gating structure is a zigzag type of power gating structure,
Wherein the second type of power gating structure is a header-only type of power gating structure.

17. The semiconductor system of claim 12, wherein the data input/output control block includes a write path control block,
wherein the write path control block includes the first and second power gating circuits and generates a write control signal using the first and second voltages in a write mode,
wherein the data input/output block includes a write driving block,
wherein the write driving block includes the third power gating circuit and transmits a data signal to a data input/output line using the first and second voltages based on the write control signal.

18. The semiconductor device of claim 17, wherein the first power gating circuit is coupled between the supply terminal of the first voltage and a supply terminal of a third voltage;
the second power gating circuit is coupled between the supply terminal of the second voltage and a supply terminal of a fourth voltage; and
wherein the write path control block further includes a first logic circuit coupled to the supply terminal of the first voltage, the supply terminal of the second voltage, the supply terminal of the third voltage and the supply terminal of the fourth voltage, the first logic circuit suitable for generating the write control signal based on a write enable signal.

19. The semiconductor device of claim 18, wherein the first logic circuit includes:
a first logic element coupled between the supply terminal of the first voltage and the supply terminal of the fourth voltage; and
a second logic element coupled between the supply terminal of the second voltage and the supply terminal of the third voltage.

20. The semiconductor device of claim 17, wherein the third power gating circuit is coupled between the supply terminal of the first voltage and a supply terminal of a fifth voltage; and wherein the write driving block further includes a second logic circuit coupled between the supply terminal of the second voltage and the supply terminal of the fifth voltage, the second logic circuit suitable for driving the global input/output line with the first voltage or the second voltage based on the write control signal and the data signal.

21. The semiconductor device of claim 12, wherein the data input/output control block includes a read path control block, wherein the read path control block includes the first and second power gating circuits and generates a read control signal using the first and second voltages in a read mode; and wherein the data input/output block includes a pipe latch block, wherein the pipe latch block includes the third power gating circuit and latches a data signal, which is transmitted through the data input/output line, using the first and second voltages based on the read control signal.

22. The semiconductor device of claim 21, wherein the first power gating circuit is coupled between the supply terminal of the first voltage and a supply terminal of a third voltage;

the second power gating circuit is coupled between the supply terminal of the second voltage and a supply terminal of a fourth voltage; and wherein the read path control block further includes a first logic circuit coupled to the supply terminal of the first voltage, the supply terminal of the second voltage, the supply terminal of the third voltage and the supply terminal of the fourth voltage, the first logic circuit suitable for generating the read control signal based on a read enable signal.

23. The semiconductor device of claim 22, wherein the first logic circuit includes:

a first logic element coupled between the supply terminal of the first voltage and the supply terminal of the fourth voltage; and a second logic element coupled between the supply terminal of the second voltage and the supply terminal of the third voltage.

24. The semiconductor device of claim 21, wherein the third power gating circuit is coupled between the supply terminal of the first voltage and a supply terminal of a fifth voltage; and wherein the pipe latch block further includes a second logic circuit coupled between the supply terminal of the second voltage and the supply terminal of the fifth voltage, the second logic circuit suitable for latching the data signal, which is transmitted through the data input/output line, based on the read control signal.

25. The semiconductor system of claim 12, wherein the data input/output control block is coupled to the data input/output block.

* * * * *